United States Patent [19]

Welz

[11] 4,346,345

[45] Aug. 24, 1982

[54] THEFT RESISTING DEVICE

[75] Inventor: Ronald C. Welz, Cerritos, Calif.

[73] Assignee: Southern California Edison Company, Rosemead, Calif.

[21] Appl. No.: 143,741

[22] Filed: Apr. 25, 1980

[51] Int. Cl.³ .................... G01R 11/24; H01R 13/00
[52] U.S. Cl. .................................. 324/110; 339/37; 361/369
[58] Field of Search ............... 324/110, 156; 340/568, 340/637; 361/364, 369, 370, 371; 339/36, 37

[56] References Cited

U.S. PATENT DOCUMENTS

| | | | |
|---|---|---|---|
| 3,904,935 | 9/1975 | Brewer | 361/366 |
| 3,915,112 | 10/1975 | Foeter | 116/319 |
| 4,034,290 | 7/1977 | Warren | 324/110 |
| 4,039,943 | 8/1977 | Topscott | 324/110 |
| 4,104,588 | 8/1978 | Westberry | 324/110 |
| 4,175,813 | 11/1979 | Mentesana | 324/110 |

OTHER PUBLICATIONS

Westinghouse Catalog 42-300, pp. 1 and 2, Dec., 1976.
Westinghouse Brochure SA-6794D4S, "High Security Meter".

Primary Examiner—Ernest F. Karlsen
Attorney, Agent, or Firm—Lyon & Lyon

[57] ABSTRACT

A theft resisting device for use as part of an electric watthour meter includes a moveable slide bar positioned in a housing within the base plate of the meter. The slide bar is normally retracted, but when unauthorized removal of the meter from its socket occurs, the bar extends thereby preventing reinstallation of the meter in the socket in any position. Locking means engages the slide bar to prevent retraction of the bar. An access aperture to the housing permits a tool to be inserted to reset the locking means and permit slide bar retraction.

13 Claims, 5 Drawing Figures

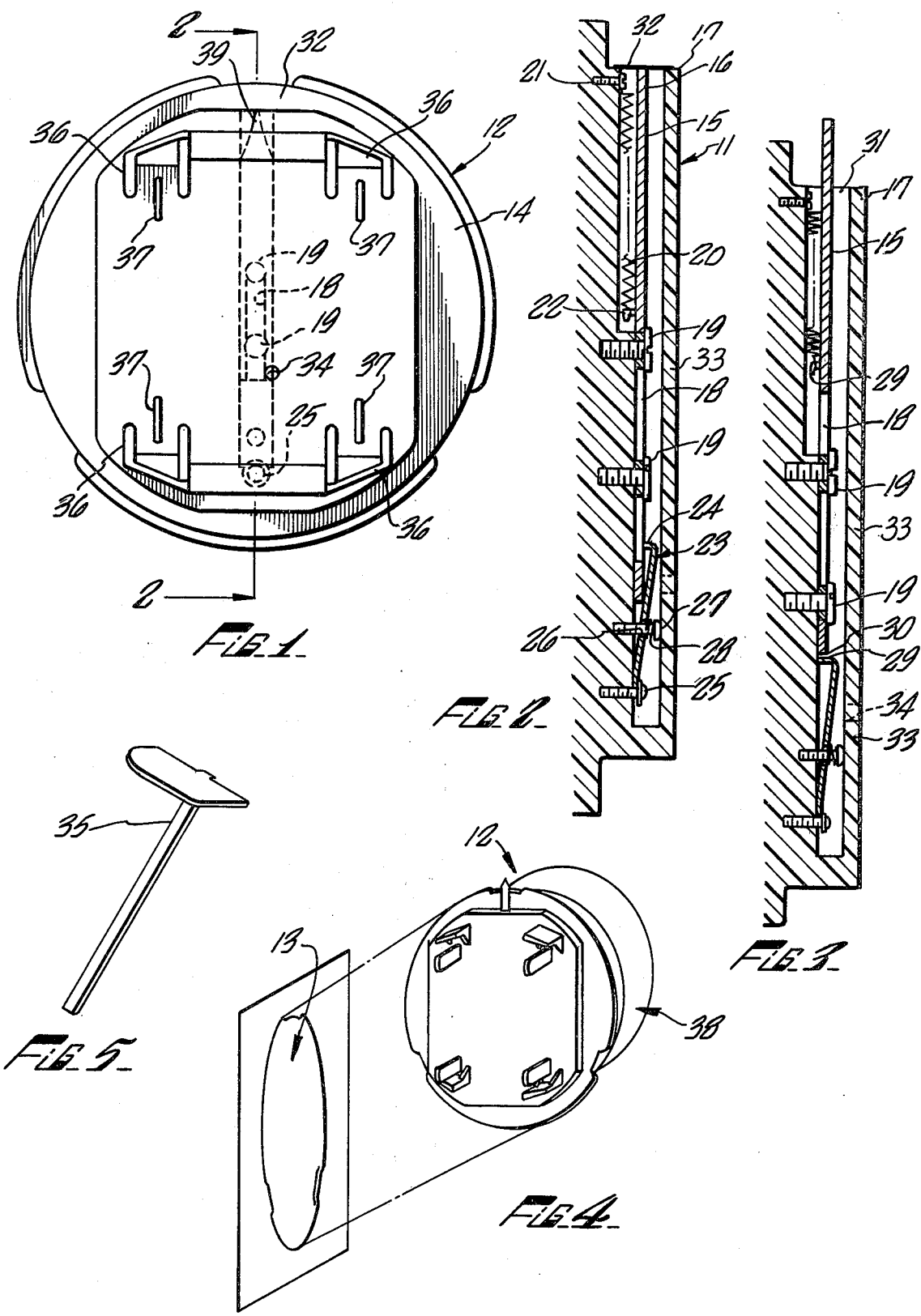

THEFT RESISTING DEVICE

BACKGROUND

This invention relates to a theft alerting device. In particular, the invention is concerned with such a device related to electric watthour meters, more particularly to prohibit unauthorized use and tampering of the meter.

With the increased cost of energy, utility companies are plagued with the theft of electricity by meter tampering. One of the ways of doing this is to remove a meter from its housing, or socket, and to reconnect the line conductors to the terminals of the meter thereby rendering the meter non-registering of used electricity. In some cases, the meter is reconnected reversedly to deregister the use of electricity. Prior to the time that the meter reader arrives to read the energy consumed, the meter is restored to is original condition.

One of the ways in which unauthorized meter tampering is noted is to use "a red flag" indicator to show that the meter has been stopped as described in U.S. Pat. No. 3,915,112 (Forrestor). A problem with these devices is that during shipping, the meter can be inverted resulting in the tripping of the indicator. As a result, the meter seal must be broken and the cover removed, to reset the meter before the meter can be used. The cover seal is the manufacturer's guarantee of accuracy to the meter and when broken, the meter must be retested before it can be resealed resulting in additional time and expense.

Another device which is known to prevent meter tampering is to have specially designed socket and mounting means such that a meter cannot be mounted in the inverted position. Such an example is shown in U.S. Pat. No. 4,034,290 (Warren) and U.S. Pat. No. 4,104,588 (Westberry). These disclose obstruction members which are provided within the box that receives the watthour meter, the obstructions being assymmetrically disposed thereby preventing misorientation of the meter in the box. In U.S. Pat. No. 4,039,943, there is disclosed a gravity actuated switch for reversing winding connections when the meter is inverted and other prior art is disclosed in U.S. Pat. No. 3,904,935 (Brewer).

A disadvantage with the prior art is that a utility may not be alerted to the attempt, albeit unsuccessful of a consumer to tamper with a meter. There is a need for utilities to be made aware of the identity of such customers.

SUMMARY

The present invention is directed to a theft resisting device for use in preventing the relocation of an element with a mating mounting and which identifies attempted thefts. The device includes a member having a leading end removable between a retractable position permitting location of the element in its mounting and a protruding position obstructing location of the element in its mounting. A locking means is biased to engage the member when the leading end is in the protruded position for preventing return of the leading end to the retracted position. A breakable or removable temporary shipping barrier can be placed ahead of the leading end to thereby retain the leading end normally retracted during shipment of the device. The breakable or removable barrier is broken or removed prior to installation when the element is removed from its mating mounting.

DESCRIPTION OF THE DRAWINGS

FIG. 1 is a rear view of an electric watthour meter showing the theft resisting device mounted within the meter base, FIG. 2 is a sectional side view along lines 2—2 of FIG. 1 showing the theft resisting device with the slide bar in retracted position, FIG. 3 is a sectional side view of the theft resisting device showing the slide bar in protruding position, FIG. 4 is perspective view of an electric watthour meter and its mating socket, the meter being remotely spaced from the socket, and FIG. 5 is a perspective view of a tool for access to the theft resisting device.

DESCRIPTION

Although the prior art, references, and embodiment are described with reference to examples of an electric watthour meter it is understood that the present invention and application of the invented resisting device is considerably wider and should not be limited to such exemplifications.

A theft resisting device 11 which can be used for preventing the reinstallation of an electric watthour meter 12 in a mating socket 13 is mounted within the rear of a base plate 14 of the electrical meter 12. The resisting device includes a slide bar 15, the leading end 16 of which is moveable into and from a housing 17. In some cases the resisting device 11 can be mounted on the base plate 14.

The slide bar 15 is provided with a slot 18 longitudinally directed, and passing through the slot 18 are two screws 19 which are screwed into the base plate 14 of the watt meter 12. The screws 19 together with the slot 18 provide a guide track for movement of the slide bar 15. Other forms of guide track, for instance, a moulded upstanding rail, could be used in place of the screws.

A helical spring 20 affixed between a screw 21 in base plate 14 and a hook 22 on the underside of slide bar 15 urges the slide bar 15 towards the prrotruded position. On the opposite side of the slide bar 15 is a locking means 23 which is in the shape of a bar with a lip 24 at its leading end. The trailing end of bar 23 is affixed by screw means 25 to the base plate 14. Midway between the ends of the locking bar 23 is an aperture 26 through which a screw 27 passes. A spring 28 biases the locking bar 23 towards the base plate 14. When the sliding bar 15 is in a protruded position the lip 24 is thus urged downwardly by the spring 28 into contact with the base plate 14 and the face 29 of the lip 24 engages the trailing end 30 of the slide bar 15. In this fashion, the slide bar cannot be retracted back into the housing 17. A covering for leading opening 31 to the housing 17 is a tape 32 for location over the opening 31 during shipping which forms a breakable or removable barrier to the protrusion of slide element 15 from the housing 17.

In the wall 33 of housing 17, there is provided an access aperture 34 through which a tool 35 can be inserted to pull the locking bar 23 upwardly so the sliding bar 15 can be returned to the retracted position. Normally, the aperture 34 will be sealed with a wax or other material. Alternatively, the aperture could be discretely hidden. The shape of the aperture 34 is shown in the figures as circular but the shape could be irregular so as to permit only a irregular mating tool 35 to pass through.

Also, on the base plate 14 of the meter, there is provided mounting means 36 for suitably locating the watthour meter 12 in the socket 13. Electric terminals 37 are provided to effect the connection of the watthour meter to the line and load conductor blades. On the forward side of base plate 14, there is connected the means for recording electrical energy flow. This is collectively shown within the cylindrical body 38.

In operation of the theft resisting device, the watthour meter 12 will be placed in its upright position as indicated in FIG. 1 of the drawings. The slide bar 15 will be in the retracted position and the tape 32 will be removed from the opening 31 to the housing 17 upon installation. On removal of the watthour meter 12 from the housing 13 and its inversion, the biasing means effected by helical spring 20 and the force of gravity causes the leading end of the slide bar 15 to protrude through the housing opening 31. The locking bar 23 will then engage the trailing end of the slide bar 15 thereby preventing retraction of the slide bar 15 into the housing 17. Only with the tool 35 can the release of the locking bar be possible thereby permitting its reset and the retraction of slide bar 15.

The leading end of the slide bar 15 may be pointed as illustrated by numeral 39. The bar may also be made of a hardened steel such as a case hardened or high carbon steel.

In alternative forms of the invention, the slide bar 15 can be made of a hollow tubular member within which is a freely rotatable member. Thus, sawing the protruding end of the slide bar 15 is difficult in the event that a temperer wishes to replace the meter in its socket. In a further alternative form, the leading end of the slide element can have a dog leg shape constituted by an offset longitudinal portion relative to the main longitudinal plane of the slide bar 15. Thus, it is advantageous in permitting the resisting device to extend sufficiently from the base plate 14 so that reinstallation can be prevented.

In other applications of the invention the electric watthour meter 12 can be replaced by some other suitable element and the mounting 13 may be replaced by another suitable mating mounting from which the element should not be removed without authority. In some cases, the housing 17 can be formed within the mating mounting 13 and the element 12 can fit therein such that removal of the element 12 will cause the operation of the theft alerting device in the mounting to prevent return of the element 12 to the mounting 13.

In a preferred form of the invention, the spring biasing means 20 is not required in urging the sliding bar 15 from the housing 17. The biasing effect is suitably attained by the force of gravity when the meter 12 is inverted. In other cases, the spring bias 20 is sufficiently forceful that, without gravity, the mere removal of the meter from its mating socket 13 is sufficient to cause the sliding bar 15 through its point 39 to puncture and break the tape 32. In yet other forms of the invention, instead of a tape 32, bounding the leading open end of the housing 17, the socket mating wall itself is sufficient to retain the leading end closed. In cases where inversion is unnecessary to obtain protrusion, a pin or the like will hold the bar 15 retracted during installation of the meter 12. After positioning the meter in the socket 13 the pin will be removed thus rendering the slide bar operative.

Although the present invention has been described in considerable detail with reference to certain preferred versions thereof, other versions are possible.

Advantages of the invention include an effective means for preventing meter tampering, and determining tampering suspects. The mountings for the meter, blades, or socket clips do not have to be altered and hence the minimum of cost is associated with the installation of meters in conventional sockets.

Therefore, the spirit and scope of the appended claims should not necessarily be limited to the description of the preferred version contained herein.

What is claimed is:

1. A device for metering electricity comprising:
 (a) a socket having a plurality of electric terminals;
 (b) an electric meter having a plurality of projecting blades, the meter being located within the socket with each blade in a respective terminal, the meter comprising a housing that includes a side wall, the side wall having an opening therethrough;
 (c) a slide mounted within the housing, the slide having a first retracted position and a second protruding position, the slide being maintained in the first retracted position completely within the housing, wherein the slide moves to the second protruding position when the meter is removed from the socket, a portion of the slide in the protruding position extending through the opening in the side wall of the housing and preventing relocation of the meter in the socket; and
 (d) locking means within the housing preventing the slide from moving from the protruding position to the retracted position.

2. A device for metering electricity comprising:
 (a) a socket having a plurality of electric terminals;
 (b) an electric meter having a plurality of projecting blades, the meter being located within the socket with each blade in a respective terminal, the meter comprising a housing that includes a side wall, the side wall having an opening therethrough;
 (c) a slide mounted within the housing, the slide having a first retracted position and a second protruding position, the slide being maintained in the first retracted position completely within the housing, wherein the slide moves to the second protruding position when the meter is removed from the socket, a portion of the side in the protruding position extending through the opening in the side wall of the housing and preventing relocation of the meter in the socket;
 (d) locking means within the housing preventing the slide from moving from the protruding position to the retracted position; and
 (e) an access aperture in the housing proximate to the locking means for entry of a tool to reset the slide to the retracted position.

3. An electric meter device having a plurality of projecting blades, the meter device being adapted for location within a socket having a plurality of terminals with the blades inserted into the terminals, the meter device comprising:
 (a) a housing comprising a side wall;
 (b) an opening through the side wall;
 (c) a slide mounted within the housing, the slide having a first retracted position completely within the housing and a second protruding position, a portion of the slide in the second protruding position extending through the opening in the side wall for preventing the meter from being inserted into the socket; and (d) locking means within the housing for preventing the slide from moving from the protruding position to the retracted position.

4. An electric meter device having a plurality of projecting blades, the meter device being adapted for location within a socket having a plurality of terminals with the blades inserted into the terminals, the meter device comprising:
   (a) a housing comprising a side wall;
   (b) an opening through the side wall;
   (c) a slide mounted within the housing, the slide having a first retracted position completely within the housing and a second protruding position, a portion of the slide in the second protruding position extending through the opening in the side wall for preventing the meter from being inserted into the socket;
   (d) locking means within the housing for preventing the slide from moving from the protruding position to the
   (e) an access aperture in the housing proximate to the locking means for entry of a tool to reset the slide to the retracted position.

5. The device as claimed in claim 1, 2 or 4 wherein the housing includes means for guiding the slide between the retracted and protruding positions.

6. The device as claimed in claim 1, 2, 3, or 4 wherein the locking means is a bar located at the trailing end of the slide, the locking bar engaging the trailing end of the slide when the slide is in the protruding position, biasing means urging the locking bar into locking engagement with the slide, the locking bar being moveable against the biasing means to a disengaging position when the slide is in the retracted position.

7. The device as claimed in claim 6 wherein the locking bar is adapted to be located over the trailing end of the slide when the slide is retracted.

8. The device as claimed in claim 1, 2, 3 or 4 wherein the slide is constituted by a high carbon or case hardened steel.

9. The device as claimed in claim 6 wherein the leading end of the slide includes a longitudinal portion offset from the longitudinal axis of the slide.

10. The device as claimed in claim 1, 2, 3 or 4 including biasing means for urging the slide to the protruding position.

11. The device as claimed in claim 1, 2, 3 or 4 wherein the slide is adapted to move into the protruding position without a biasing means, gravity effecting this movement.

12. The device as claimed in claim 1 wherein the slide is a hollow tube with a concentric rotatable member within the hollow tube.

13. The device as claimed in claim 1, 2, 3 or 4 including a removable barrier comprising a tape adapted to adhere to the housing across the opening.

* * * * *